United States Patent [19]

Shiomi et al.

[11] Patent Number: 5,436,036
[45] Date of Patent: Jul. 25, 1995

[54] METHOD OF SYNTHESIZING HARD MATERIAL

[75] Inventors: Hiromu Shiomi; Naoji Fujimori; Nobuhiro Ota; Takahiro Imai, all of Hyogo, Japan

[73] Assignee: Sumitomo Electric Industries, Ltd., Osaka, Japan

[21] Appl. No.: 79,105

[22] Filed: Jun. 17, 1993

Related U.S. Application Data

[62] Division of Ser. No. 584,912, Sep. 18, 1990, Pat. No. 5,242,663.

[30] Foreign Application Priority Data

Sep. 20, 1989 [JP] Japan ................................. 1-245749
Aug. 31, 1990 [JP] Japan ................................. 2-231649

[51] Int. Cl.$^6$ ............................................. B05D 3/06
[52] U.S. Cl. ................................... 427/575; 427/576; 427/577; 427/215
[58] Field of Search ............ 427/575, 576, 577, 255.3, 427/249, 212, 215

[56] References Cited

U.S. PATENT DOCUMENTS

| | | |
|---|---|---|
| 4,414,085 | 11/1983 | Wickersham et al. . |
| 4,434,188 | 2/1984 | Kamo et al. . |
| 4,446,168 | 5/1984 | Kato et al. ........................... 427/574 |
| 4,902,535 | 2/1990 | Garg et al. ....................... 427/255.3 |
| 5,099,790 | 3/1992 | Kawakami ........................... 427/571 |

FOREIGN PATENT DOCUMENTS

| | | |
|---|---|---|
| 20279895 | 8/1988 | European Pat. Off. . |
| 20305903 | 3/1989 | European Pat. Off. . |
| 59-3098 | 1/1984 | Japan . |
| 58-110494 | 1/1984 | Japan . |
| 59-63732 | 4/1984 | Japan . |
| 61-174378 | 8/1986 | Japan . |
| 63-107899 | 5/1988 | Japan . |

OTHER PUBLICATIONS

Bachmann, P. K. et al, "Emerging Technology of Diamond Thin Films"; Chemical & Engineering News May 15, 1989 pp. 24–38.

1046B Extended Abstracts/Electrochemical Society 87-2 (1987), Princeton, New Jersey, USA, Abstract No.: 1103, p. 1536, article entitled: "Deposition of Boron Nitride In A Microwave Discharge" By Matsumoto et al.

*Primary Examiner*—Shrive Beck
*Assistant Examiner*—Bret Chen
*Attorney, Agent, or Firm*—W. G. Fasse; W. F. Fasse

[57] ABSTRACT

A method of vapor-phase synthesizing a hard material use a raw material gas supplied into a reaction tube (6) while irradiating a region of the reaction tube (6) with microwaves (18) of a prescribed frequency for causing a synthesizing reaction to produce the hard material along a prescribed direction, by a plasma generation. In the reaction tube (6), at least two plate electrodes (17a, 17b, 19a, 19b) are oppositely arranged in parallel vertically to electric fields of the microwaves (18), so that the plasma is excited between the plate electrodes (17a, 17b, 19a, 19b) for vapor-phase synthesizing the hard material. The microwaves (18) of high electric power are introduced into the reaction tube (6) through a waveguide (5) without loss, so that strong electric fields can be homogeneously and stably distributed between the opposite plate electrodes.

13 Claims, 3 Drawing Sheets

METHOD OF SYNTHESIZING HARD MATERIAL

CROSS-REFERENCE TO RELATED APPLICATIONS

This is a divisional of U.S. patent application Ser. No. 07/584,912 filed: Sep. 18, 1990, now U.S. Pat. No. 5,242,663.

FIELD OF THE INVENTION

The present invention relates to a method of synthesizing a hard material, such as diamond or cubic boron nitride, which is used in connection with tools thermal conductors, or as semiconductor material. More particularly, the invention relates to a method of homogeneously vapor-phase synthesizing a high-quality hard material at a high rate over a wide area.

BACKGROUND INFORMATION

Hard materials such as diamond, cubic boron nitride and wurtzite boron nitride are widely applied to tools such as cutting tools, wear-resistant components, abrasive grains and the like due the high hardness of these material. These materials are also applied to heat radiation substrates for semiconductor elements due to their high thermal conductivity. Further, research has been made in order to apply these materials to optical elements and semiconductor materials for effectuating the light transmissivity thereof.

These materials, which are stable under high pressure as high pressure phase materials, were initially artificially synthesized only under superhigh pressure. Various methods have been recently developed for synthesizing such hard materials, including diamond, from decompressed vapor phases. Among such methods of vapor-phase synthesizing hard materials, a microwave plasma CVD process of generating plasma by microwaves for decomposing gas and depositing a hard material on a substrate is an excellent method which can synthesize a hard material of high purity. Japanese Patent Laying-Open Gazettes Nos. 58-110494, 59-3098 and 59-63732, and U.S. Pat. No. 4,434,188 disclose methods for synthesizing hard materials through the microwave plasma CVD process.

FIG. 1 shows a conventional apparatus for vapor-phase synthesizing diamond through microwaves. This apparatus will now be schematically described.

Referring to FIG. 1, microwaves oscillated by a magnetron oscillator 1 are applied to a substrate 8, which is placed on a support 7 provided in a reaction tube 6, through an isolator 2, a power monitor 3, a tuner 4, and a waveguide 5. Raw material gas, which is prepared by mixing methane gas, hydrogen etc. at a prescribed ratio, for example, is introduced through a gas inlet port 9 and exhausted from an exhaust port 10 by a pump (not shown). The discharge of the raw material gas is so adjusted that a prescribed pressure is maintained in the reaction tube 6. Plasma 11 is generated by the energy of the microwaves, to form diamond on the substrate 8. A cooling water supply tube 13 supplies an applicator 12 with cooling water, which in turn is discharged from a cooling water discharge tube 14, in order to prevent an excessive heating of the reaction tube 6.

The waveguide 5 implements optimal conditions of compatibility by movement of a plunger 15 or adjustment of the tuner 4 in response to the wavelength of the introduced microwaves.

As shown in FIG. 1, the raw material gas is introduced into and exhausted from the apparatus along arrows A and B, respectively.

Japanese Patent Laying-Open Gazette No. 61-174378 or the like also discloses a method of synthesizing cubic boron nitride through such a microwave plasma CVD apparatus.

In general, electromagnetic waves in a frequency or range of of 300 MHz to 300 GHz are called microwaves. The electromagnetic waves of this frequency domain are easily absorbed by molecules, and have wavelengths of 1 m to 1 mm, which are short compared to the size of a reaction tube. Thus, it is possible to efficiently generate plasma in gas under a wide range of pressures. Further, the microwaves of this frequency domain can efficiently supply electric power through a waveguide having a practical size of not more than scores of centimeters, with smaller problems of loss and leakage in a supply path of a coaxial cable etc., dissimilarly to waves of a lower frequency domain.

However, a method of and an apparatus for synthesizing a hard material through the aforementioned conventional microwave plasma CVD apparatus have the following problems:

While microwaves of 2.45 GHz in frequency are widely industrially employed, standing waves are caused in a cycle of a half-wave length thereof if the microwaves are trapped in a reaction tube. Thus, plasma is heterogeneously generated in response to a strength distribution of the standing waves. Therefore, it is impossible to homogeneously generate plasma over a wide area for synthesizing a hard material.

The microwaves have such a property that the same can stably generate plasma under a higher gas pressure and improve the growth rate of the hard material as the frequency thereof is increased. When the frequency of the microwaves is thus increased, however, the wavelength is shortened whereby areas where large amplitude portions of the standing waves occur, are reduced.

In order to improve such growth heterogeneity in the vapor synthesis of a hard material, there has been reported a method of applying a dc magnetic field for controlling the streamline of plasma and a method of reducing the gas pressure in a reaction tube, in Japanese Patent Laying-Open Gazette No. 63-107899. In any of these methods, however, the mean free paths of active molecule species and electrons contained in the plasma must be kept long. Thus, the gas pressure in the reaction tube must be reduced to not more than 10 Torr, and the hard material is grown at an extremely slow rate of less than 1 $\mu$m/h.

Thus, the conventional method of synthesizing a hard material such as diamond by the plasma CVD process has been significantly restricted in growth area and growth rate, and it has been difficult to mass-synthesize the hard material.

SUMMARY OF THE INVENTION

It is an object of the present invention to provide a method of and an apparatus for vapor-phase synthesizing a hard material, such as diamond, cubic boron nitride or wurtzite boron nitride on the surface of a wider area substrate at a higher growth rate by enabling the generation of high-concentration plasma over a wider range than possible in the prior art.

The present method of synthesizing a hard material is adapted to vapor-phase synthesizing a hard material by supplying raw material gas into a reaction tube and introducing microwaves of a prescribed frequency, i.e. the magnetron source frequency, into a region of the reaction tube for causing a synthesizing reaction of the hard material along a prescribed direction. For performing this synthesizing method, at least two plate electrodes are oppositely arranged in parallel vertically or rather perpendicularly to the electric fields (arrow C) of the microwaves and plasma is excited between the plate electrodes for the vapor-phase synthesizing of a hard material.

According to this method of synthesizing a hard material, it is possible to introduce microwaves of high electric power into the reaction tube by a waveguide at a small loss, as shown by the examples described below and to homogeneously and stably distribute or maintain strong electric fields between the opposite plate electrodes. The plasma generated by the electric fields is stable under a higher reaction pressure, and homogeneous over a wider area than achieved in the prior art.

Although the present method of synthesizing a hard material is similar to a synthesizing method employing a plane-parallel plate electrode type plasma CVD apparatus using a high frequency which is lower than the frequency of microwaves, refer to U.S. Pat. No. 4,414,085, for example, it is difficult to stably generate a strong plasma under a relatively high pressure of at least 100 Torr in a frequency domain lower than that of the microwaves, and this method is improper for the synthesis of a hard material. When the frequency used is below the range of microwaves, further significant problems are caused such as loss in an inlet path for a coaxial cable etc. including a power reflection caused by impedance non-conformity at an inlet port for the reaction tube.

The directions of electric fields and magnetic fields of microwaves which are guided by a waveguide depend on the configuration of the waveguide. The counter electrodes must necessarily be arranged vertically or rather perpendicularly to the direction (c) of the electric fields of the microwaves, so that strong electric fields can be generated between the counter electrodes. Further, the microwaves must be with the electrodes.

The apparatus according to the invention for synthesizing a hard material comprises a reaction tube, means for supplying raw material gas into the reaction tube, and means for generating plasma by introducing microwaves in a prescribed direction in the vicinity of a base material provided in the reaction tube for depositing a hard material. According to the present apparatus, the reaction tube is provided with at least two plate electrodes which are arranged in parallel to each other and vertically or rather perpendicularly to electric fields of the microwaves through a region provided with a base material for depositing the hard material.

It is possible to provide any suitable number of counter electrodes exceeding two. Such a large number of counter electrodes themselves may serve as base materials for growing the hard material, or a base material may be arranged between each neighboring pair of these electrodes, so that the hard material can be grown over a wider area. Thus, the yield of the hard material can be increased. Alternatively, fine particles can be arranged between the counter electrodes as base materials, thereby easily synthesizing abrasive grains of the hard material.

The distance between the opposite plate electrodes is preferably at least 5 mm, in order to facilitate the flow of reaction gas. More preferably, the distance is not more than the wavelength of the microwaves.

At least the reaction tube 6 is made of an electrically insulating material such as quartz, alumina, beryllia or boron nitride, which has small microwave transmission loss. The plate electrodes are preferably made of a heat-resistant metal material having a high microwave reflection factor, such as SUS, Mo or W, for example. If the plate electrodes also serve as the base materials for growing the hard material, the base materials for the plate electrodes are prepared by using a conductive material such as a metal or semiconductor material.

These and other objects, features, aspects and advantages of the present invention will become more apparent from the following detailed description of the present invention when taken in conjunction with the accompanying drawings.

DESCRIPTION OF THE PREFERRED EMBODIMENTS

EXAMPLE 1

Figure 1:
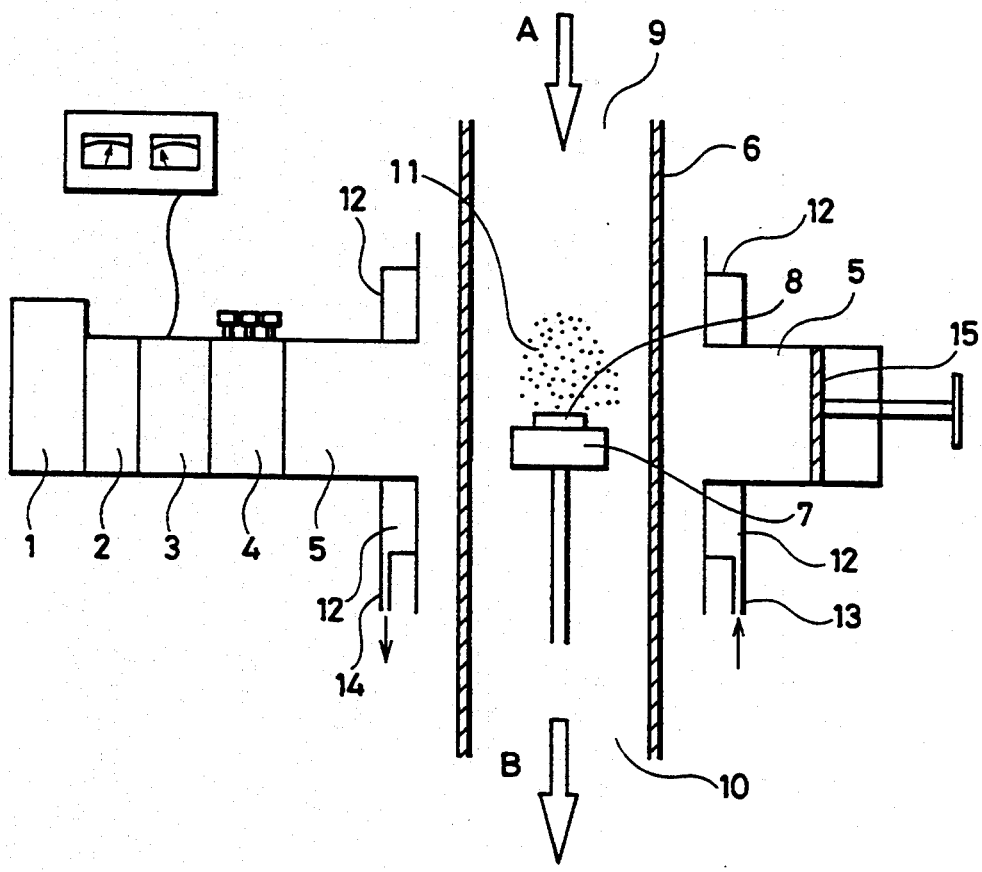
FIG. 1 is a sectional view typically showing a conventional vapor synthesizing apparatus employed for vapor-phase synthesizing diamond.
Figure 2:
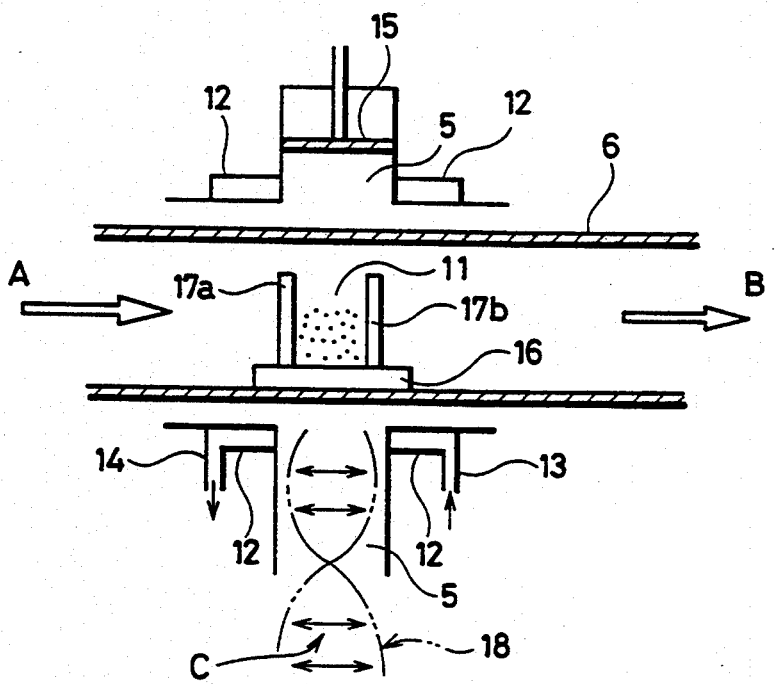
FIG. 2 is a sectional view typically showing an apparatus of the invention for synthesizing a hard material employed in Example 1 of the invention.

According to the present invention, a hard material is vapor-phase synthesized by the present apparatus shown in FIG. 2. Referring to FIG. 2, microwaves 18 are first applied through a waveguide 5 to a space defined between two base materials 17a and 17b which are oppositely placed on a support 16 provided in a reaction tube 6. While no detail of microwave generation means is shown in FIG. 2, the microwaves 18 are oscillated by a magnetron oscillator 1 shown in FIG. 1 and introduced into the reaction tube 6 through an isolator 2, a power monitor 3, a tuner 4 and the waveguide 5, similarly to the conventional apparatus shown in FIG. 1.

The two base materials 17a and 17b, which are made of silicon forms substrates to be coated and, are arranged vertically or rather perpendicularly to the direction (shown by arrows C) of electric fields of the microwaves 18, to serve as counter electrodes which establish a homogenous and stable electric field between these electrodes. Plasma 11 is generated by the microwaves 18 which are introduced between the base materials 17a and 17b, whereby raw material gas is vapor-phase synthesized to simultaneously form hard material films on the base materials 17a and 17b, for example in the form of two flat plates. A cooling water supply tube 13 supplies an applicator 12 with cooling water, which in turn is discharged from a cooling water discharge tube 14, in order to prevent excessive heating of the support 16. Arrows A and B indicate the introduction and exhaustion, respectively of raw material gas.

Such an apparatus was employed in Example 1 for synthesizing diamond under the following operating conditions: The reaction tube 6 had an inner diameter of 60 mm. The base materials 17a and 17b were prepared as silicon discs having a diameter of 50 mm and a thickness of 3 mm. The spacing between the discs was 25 mm. A reaction gas containing $H_2$ and $CH_4$ in the ratio 10:2, was supplied into the reaction tube 6, as shown by arrow A discharge of the reaction gas, arrow B, was so adjusted that the pressure in the reaction tube 6 was 60 Torr. The input power of the microwaves was 600 W.

As a result, diamond films were formed on both of the base materials 17a and 17b over ranges of 40 mm in diameter at a high growth rate of 5 $\mu$m/h. Such an effective result was obtained since the plasma 11 was concentrated in the region of between the plates of the base materials 17a and 17b.

Although the base materials 17a and 17b are made of silicon in Example 1, a material for such base materials 17a and 17b, also serving as counter electrodes, in the form of plate electro may alternatively be made of a carbon material, a conductive metal material, or a semiconductor material other than Si, such as SiC or Ge, for example. Such a base material may be applied onto the surface of an insulating material which insulates the plate electrodes 17a, 17b from the waveguide 5 which introduces the microwaves 18 into the region between said plate electrodes 17a, 17b.

Carbon source gas serving as the reaction gas may be prepared of hydrocarbon other than $CH_4$, alcohol, ketone or the like. Alternatively, solid carbon may be decomposed in a vapor phase to be supplied as a raw material.

EXAMPLE 2

The apparatus employed in Example 2 and the actual operating conditions were substantially the same as those of Example 1. Example 2 was different from Example 1 in that the reaction gas containing $H_2$ and $CH_4$ in the ratio 100:2 was supplied and Ar was added to the same while its discharge was so adjusted as to increase the pressure in a reaction tube 6, to 100 Torr.

As the result, it was possible to synthesize diamond films at a growth rate of 10 $\mu$m/h.

A similar effect can be obtained by adding inactive gas such as He, Ne, Kr, Xe or Rn in place of Ar for similarly stabilizing the plasma 11.

EXAMPLE 3

Figure 3:
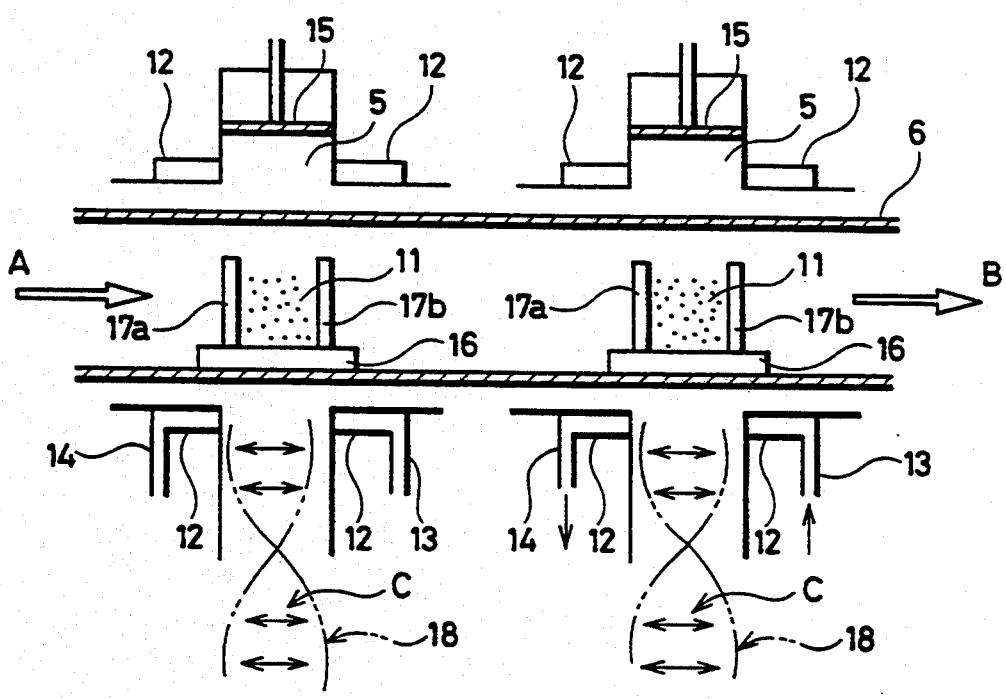
FIG. 3 is a sectional view typically showing the structure of an apparatus of the invention for synthesizing a hard material employed in Example 3 of the invention.

As shown in FIG. 3, microwaves were supplied to two portions of one reaction tube 6 with an input power of 600 W, to vapor-phase synthesize diamond films on two pairs of base materials 17a and 17b under conditions identical to those of Example 1. As the result, it was possible to synthesize diamond films on the base materials 17a and 17b over ranges of 30 mm in diameter at a rate of 5 $\mu$m/h.

EXAMPLE 4

Figure 4:
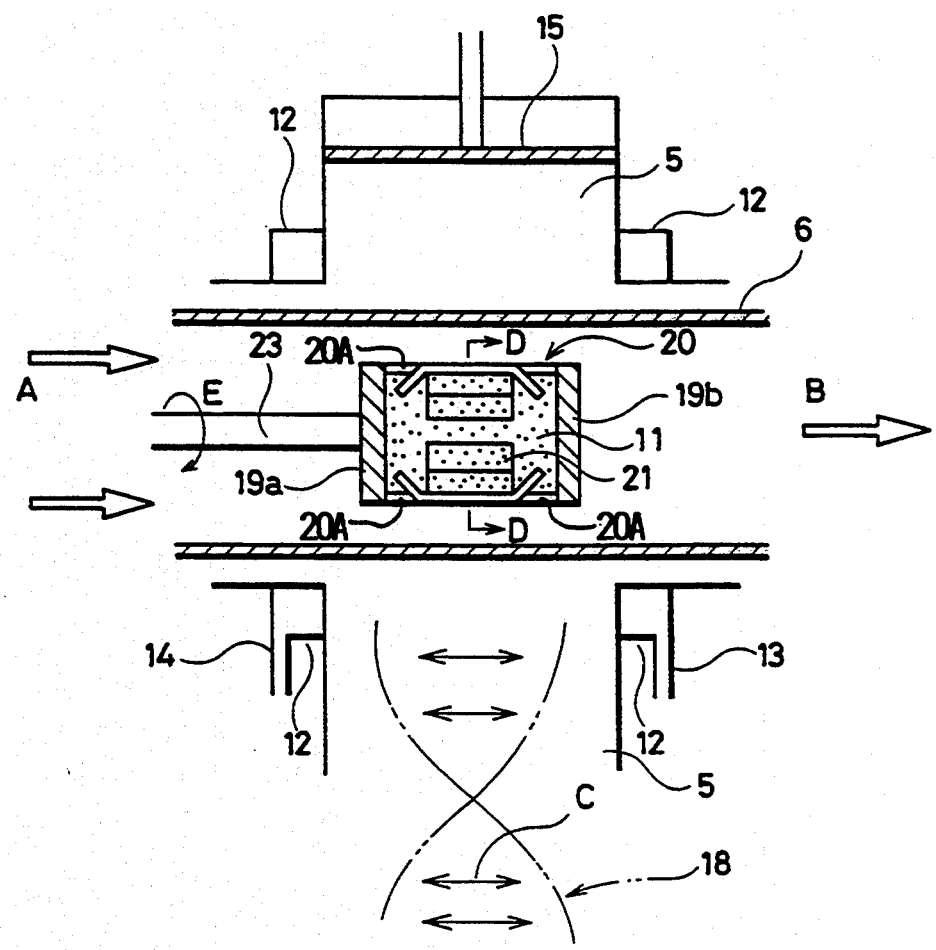
FIG. 4 is a sectional view typically showing the structure of an apparatus of the invention for synthesizing a hard material employed in Example 4 of the invention.
Figure 5:
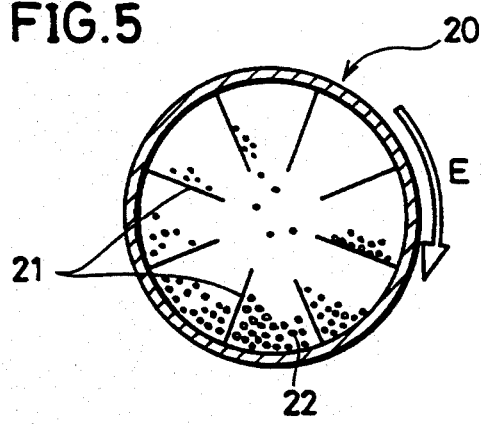
FIG. 5 is a sectional view taken along the line D—D in FIG. 4.

Example 4 was carried out in an apparatus shown in FIG. 4, illustrating a reaction tube 6 and microwave generation means of the same construction as in Example 1. In Example 4, no base materials were employed as counter electrodes but a quartz jig 20 was formed by a cylindrical member having counter electrodes 19a and 19b on both end surfaces thereof. FIG. 5 is a sectional view taken along the line D—D in FIG. 4. As shown in FIG. 5, the quartz jig 20 has small partition plates 21, so that diamond abrasive grains 22 provided in its interior as base materials can be stirred by rotating the quartz jig 20 about a shaft 23, which is coaxial with a reaction tube 6, along an arrow E. The raw material gas enters into the jig 20 through holes 20A.

Such an apparatus was employed for vapor-phase synthesizing diamond under conditions identical to those of Example 2. As the result, the diamond abrasive grains of 100 $\mu$m in diameter, which were provided in the quartz jig 20, were grown into particles of 200 $\mu$m in diameter within one hour.

EXAMPLE 5

Similarly to Example 1, the apparatus shown in FIG. 2 was employed and three silicon discs having a diameter of 50 mm and a thickness of 3 mm were arranged as base materials vertically to the direction C of electric fields of microwaves 18 under the same conditions, of reaction gas and microwaves as in Example 1. Diamond was synthesized under pressure of 20 Torr whereby the overall base materials were covered with plasma.

As the result, diamond films were formed over the entire surfaces of the base materials 50 mm in diameter at a growth rate of 0.2 $\mu$m/h.

When the pressure was increased to 40 Torr, the mean growth rate of diamond was reduced to 0.05 $\mu$m/h. When the pressure was further increased to 50 Torr, diamond was merely partially grown on the base materials.

According to Example 5, it was possible to homogeneously form diamond films on all of three or more base materials under pressure of not more than 40 Torr, thereby increasing the amount of generation of diamond.

While carbon source gas and hydrogen were mixed to prepare the raw material gas and inactive gas was further added thereto in the aforementioned Examples, the known fact has been experimentally confirmed that the quality of diamond is improved with an increase of transmissivity of the synthesized diamond etc. by employing or adding a material containing oxygen as or to the raw material gas. The invention also effectively uses this fact. The material containing oxygen can be prepared of alcohol, ketone, ether, $O_2$, $H_2O$, CO, $CO_2$, $NO_2$, NO, $O_3$ or the like, for example.

EXAMPLE 6

A synthesizing apparatus similar to that shown in FIG. 1 was employed and two Si base materials were arranged also similarly to Example 1. A reaction gas containing $H_2$, Ar, $NH_3$ and $B_2H$ in the ratios 100:40:10:3 was supplied and the pressure was maintained at 25 Torr. Microwaves of 800 W were introduced into the reaction gas and reaction was caused for 20 hours, whereby films of a hard material were grown on both base materials over ranges of 25 mm in diameter. The central portions of the hard material films had a maximum thickness of 7 $\mu$m. The crystal structure of this hard material was examined by X-ray diffraction, whereby it was found that the material was made of cubic boron nitride.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of vapor-phase synthesizing a hard material selected from the group consisting of diamond, cubic boron nitride and wurtzite boron nitride on a base material, comprising the following steps:
   (a) forming a reaction space between at least two plate electrodes arranged in parallel and opposite to each other in a reaction tube,
   (b) supplying a raw material gas into said reaction space,
   (c) generating microwaves having a particular microwave frequency, and
   (d) introducing said microwave into said reaction space in a particular direction relative to said electrodes such that an electric field of said microwaves is directed perpendicularly to said electrodes, for generating a plasma and causing a vapor phase synthesizing reaction to form said hard material by said plasma between said plate electrodes.

2. The method of claim 1, further comprising forming said plate electrodes as silicon plates which form said base material for said synthesizing.

3. The method of claim 1, further comprising mixing hydrogen gas and an inactive gas and a carbon source gas for preparing said raw material gas, wherein said hard material being synthesized is diamond.

4. The method of claim 1, wherein a gas containing oxygen is employed as said raw material gas.

5. The method of claim 1, wherein a gas containing $NH_3$ and $B_2H_6$ is employed as said raw material gas and wherein said hard material being synthesized is cubic boron nitride.

6. The method of claim 1, further comprising providing said base material within said reaction space as a substrate for synthesizing said hard material.

7. The method of claim 6, wherein said base material comprises particles having a diameter of about 100 $\mu$m for synthesizing abrasive grains of said hard material.

8. The method of claim 7, further comprising stirring said fine particles during said synthesizing.

9. The method of claim 1, wherein said particular microwave frequency is a frequency within the range of 300 MHz to 300 GHz.

10. The method of claim 1, wherein said particular direction of introducing said microwaves into said reaction space is such that said microwaves progress in a direction parallel to said plate electrodes.

11. The method of claim 1, wherein said synthesizing is carried out with a growth rate of said hard material of at least 5 $\mu$m/hour.

12. The method of claim 1, wherein said synthesizing is carried out over a surface area of at least 30 mm diameter.

13. The method of claim 1, wherein said step of supplying a raw material gas is carried out at a pressure of at least 10 Torr.

* * * * *

UNITED STATES PATENT AND TRADEMARK OFFICE
CERTIFICATE OF CORRECTION

PATENT NO.   :   5,436,036
DATED        :   July 25, 1995
INVENTOR(S)  :   Shiomi et al.

It is certified that error appears in the above-identified patent and that said Letters Patent is hereby corrected as shown below:

Title page, item [57] Abstract, line 2, replace "use" by --uses--.

Col. 1, line 13, after "tools" insert --,--;
       line 24, replace "material." by --materials.--.

Col. 2, line 8, after "frequency" insert --domain--.

Col. 3, line 43, after "be" insert --introduced to progress in parallel--.

Col. 5, line 11, after "arrow A" insert --. The--;
       line 23, replace "electro" by --electrodes--.

Col. 7, line 23, after "by" insert --reacting said raw material gas in--.

Signed and Sealed this

Fourteenth Day of November, 1995

Attest:

BRUCE LEHMAN

*Attesting Officer*    *Commissioner of Patents and Trademarks*